United States Patent [19]
Maruyama et al.

[11] Patent Number: 5,335,256
[45] Date of Patent: Aug. 2, 1994

[54] SEMICONDUCTOR SUBSTRATE INCLUDING A SINGLE OR MULTI-LAYER FILM HAVING DIFFERENT DENSITIES IN THE THICKNESS DIRECTION

[75] Inventors: Tomoko Maruyama, Isehara; Takashi Iizuka, Atsugi, both of Japan

[73] Assignee: Canon Kabushiki Kaisha, Tokyo, Japan

[21] Appl. No.: 851,792

[22] Filed: Mar. 16, 1992

[30] Foreign Application Priority Data

Mar. 18, 1991 [JP] Japan ................. 3-077149

[51] Int. Cl.$^5$ ................. G21K 5/00
[52] U.S. Cl. ................. 378/35; 378/34; 427/249
[58] Field of Search ................. 378/35, 34, 84; 427/249, 255, 255.2, 255.3, 255.7, 404, 419.2, 419.7, ; 428/469, 698, 699, 333

[56] References Cited

U.S. PATENT DOCUMENTS

| | | | |
|---|---|---|---|
| 4,701,391 | 10/1987 | Lentfer et al. | 378/35 |
| 4,724,169 | 2/1988 | Keem et al. | 427/249 |
| 4,941,942 | 7/1990 | Bruns | 427/249 |
| 5,012,500 | 4/1991 | Watanabe et al. | 378/34 |
| 5,052,033 | 9/1991 | Ikeda et al. | 378/35 |
| 5,082,695 | 1/1992 | Yamada et al. | 427/249 |
| 5,196,283 | 3/1993 | Ikeda et al. | 378/34 |

FOREIGN PATENT DOCUMENTS

| | | |
|---|---|---|
| 53-24785 | 7/1978 | Japan . |
| 54-27711 | 9/1979 | Japan . |

*Primary Examiner*—David P. Porta
*Assistant Examiner*—Kim-Kwok Chu
*Attorney, Agent, or Firm*—Fitzpatrick, Cella, Harper & Scinto

[57] ABSTRACT

An X-ray mask support has an X-ray permeable film and a support frame supporting the film and the X-ray permeable film mainly includes a single-layer film having different densities in its thickness direction or a multi-layer laminate film of layers having different densities, but being constituted of compounds having the same main component. The X-ray mask support can be used as an X-ray mask structure for X-ray lithography by providing an X-ray absorber on the X-ray permeable film. The X-ray permeable film exhibits a high permeability for X-rays and visible/near infrared rays and does not bend even by X-ray irradiation, thereby achieving X-ray exposure of high precision and high resolution.

93 Claims, 4 Drawing Sheets

SEMICONDUCTOR SUBSTRATE INCLUDING A SINGLE OR MULTI-LAYER FILM HAVING DIFFERENT DENSITIES IN THE THICKNESS DIRECTION

BACKGROUND OF THE INVENTION

1. Field of the Invention

The present invention relates to an X-ray mask support for use in X-ray lithography, an X-ray mask structure using tills X-ray mask support, and an X-ray exposure method using of the X-ray mask structure.

2. Related Background Art

Heretofore, much attention has been paid to X-ray lithography as a promising technique for the formation of an extremely fine pattern having a minimum line width of 1 $\mu$m or less, for example, the formation of a fine pattern for semiconductor devices. With the reduction of the line width of the pattern on integrated circuits which is required to satisfy density increase and speed-up of semiconductor integrated circuits in recent years, various techniques particularly regarding an X-ray mask support and an X-ray mask structure have been investigated to improve the resolution of the fine pattern of an X-ray absorber which is formed on the X-ray mask structure. The X-ray mask support for use in the X-ray lithography is mainly comprised of an X-ray permeable film and a support frame for supporting the X-ray permeable film. Furthermore, the X-ray mask support having a desired X-ray absorber fine pattern on the X-ray permeable film is called the X-ray mask structure.

As some improved examples of conventional techniques, for example, Japanese Patent Publication No. 53-24785 describes an example using a silicon carbide film as the X-ray permeable film obtained by a CVD method. In addition, Japanese Patent Publication No. 54-27711 describes the X-ray mask structure which can be obtained by forming a silicon nitride layer having a thickness of 0.5 $\mu$m or less as to be adjacent to the support frame by a conventional manner such as the CVD method, and then forming a silicon carbide layer having a thickness of 5 $\mu$m or less on the silicon nitride layer by the use of a gas containing C and H such as methane, ethylene or acetylene in accordance with a plasma reaction to produce a two-layer composite film as the X-ray permeable film. In this kind of X-ray mask structure, mechanical strength and productivity which are conventional problems to be solved can be mainly improved. Moreover, since this composite film is provided with the silicon nitride layer which is adjacent to the support frame, the X-ray permeable film also has excellent resistance to an alkali at the time of the formation of the support frame.

However, in the above-mentioned conventional X-ray mask structures, if the X-ray permeable film is constituted of a single layer film, X-ray permeability and visible/near infrared ray permeability of alignment light are not considered to be sufficient, which causes the deterioration of throughput and alignment precision.

Furthermore, in the case that the X-ray permeable film comprises a multi-layer structure film of silicon carbide and silicon nitride, the X-ray mask structure bends and strain occurs therein inconveniently owing to a difference of thermal expansion coefficients inherent in the materials constituting the respective layers, when heated by the irradiation of X-rays. This drawback leads to the deterioration of mask precision, and so the above-mentioned film structure is unsuitable as the X-ray mask support in which extremely strict position precision is required. Moreover, when the multi-layer composite film comprising such different kinds of materials is employed as the X-ray permeable film, manufacturing devices and manufacturing processes are complicated. Particularly, when the CVD method utilized, a specific gas such as a silane gas must be used, so that hazard increases and a large facility investment for the safety assurance is required, which is not economical.

SUMMARY OF THE INVENTION

An object of the present invention is to provide an X-ray mask support and an X-ray mask structure by which the above-mentioned problems of conventional techniques can be solved and which are excellent in X-ray permeability and visible/near infrared ray permeability and do not bend even by X-ray irradiation.

Another object of the present invention is to easily and safely provide an excellent X-ray mask structure which can achieve an X-ray exposure of high precision and high resolution.

The above-mentioned objects can be achieved by the following aspects of the present invention.

Thus, according to an aspect of the present invention, there is provided an X-ray mask support having an X-ray permeable film and a support frame for supporting said X-ray permeable film, said X-ray permeable film mainly comprising a single-layer film having different densities in its thickness direction.

According to another aspect to the present invention, there is provided an X-ray mask support having an X-ray permeable film and a support frame for supporting said X-ray permeable film, said X-ray permeable film mainly comprising a multi-layer laminate film in which adjacent layers have different densities, and all the layers of said multi-layer laminate film being constituted of compounds having the same main constitutional element.

According to still another aspect of the present invention, there is provided an X-ray mask structure having an X-ray permeable film, a support frame for supporting said X-ray permeable film and an X-ray absorber supported by said X-ray permeable film, said X-ray permeable film mainly comprising a single-layer film having different densities in its thickness direction.

According to still another aspect of the present invention, there is provided an X-ray mask structure having an X-ray permeable film, a support frame for supporting said X-ray permeable film and an X-ray absorber supported by said X-ray permeable film, said X-ray permeable film mainly comprising a multi-layer laminate film in which adjacent layers have different densities, and all the layers of said multi-layer laminate film being constituted of compounds having the same main constitutional element.

According to still another aspect of the present invention, there is provided an X-ray exposure method having a step of exposing a member to be exposed to X-rays through an X-ray mask structure, said X-ray mask structure having an X-ray permeable film, a support frame for supporting said X-ray permeable film and an X-ray absorber supported on said X-ray permeable film, and said X-ray permeable film mainly comprising a single-layer film having different densities in its thickness direction.

According to still another aspect of the present invention, there is provided an X-ray exposure method having a step of exposing a member to be exposed to X-rays through an X-ray mask structure, said X-ray mask structure having an X-ray permeable film, a support frame for supporting said X-ray permeable film and an X-ray absorber supported on said X-ray permeable film, said X-ray permeable film mainly comprising a multi-layer laminate film in which adjacent layers have different densities, and all the layers of said multi-layer laminate film being constituted of compounds having the same main constitutional element.

DETAILED DESCRIPTION OF THE PREFERRED EMBODIMENTS

The main feature of the present invention resides in that the X-ray permeable film of an X-ray mask support or an X-ray mask structure is constituted of a film having continuously or discontinuously different densities in its thickness direction. In the case that the above-mentioned film has continuously different densities, any borderline between the different densities cannot be clearly observed, and such a constitution is called a single-layer film in the present invention. In the case that the above-mentioned film has discontinuously different densities, the borderline between the different densities can be clearly observed, and such a constitution is called a multi-layer laminate film in the present invention. Furthermore, in the present invention, the film having the different densities can be formed by the use of a sputtering method. In this film formation, an inert gas is used as a sputtering gas and a gas pressure may be changed, if necessary, so that a low-density region and a high-density region are partially formed in the film thickness direction, whereby the film having the continuously or discontinuously different densities can be formed easily and safely.

Therefore, in the above-mentioned multi-layer laminate film, the respective layers are different in properties (density, crystalline state and the like) and are constituted of the compounds having the same constitutional element. In the present invention, it is preferred that the film having the different densities is formed by partially preparing a region having columnar growth structures as the low-density region in the thickness direction of the film.

Figure 4A:
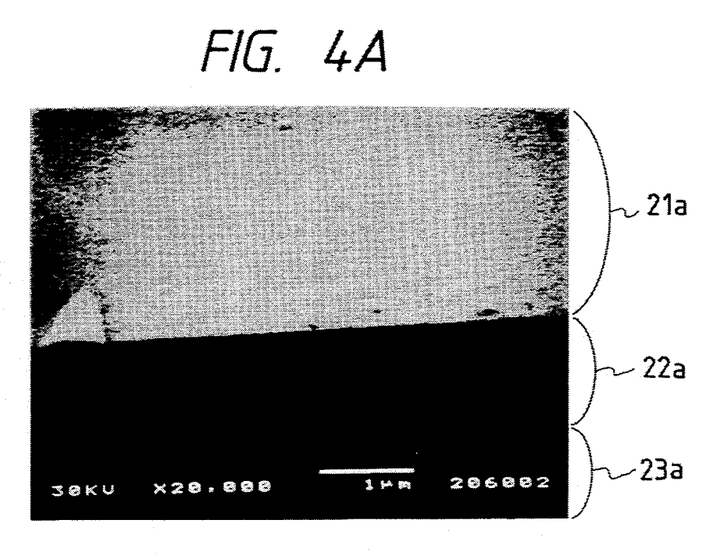
FIG. 4A is a sectional SEM photograph of a silicon carbide film formed by an RF (radio frequency) magnetron sputtering method under a low argon pressure (0.8 mTorr)
Figure 4B:
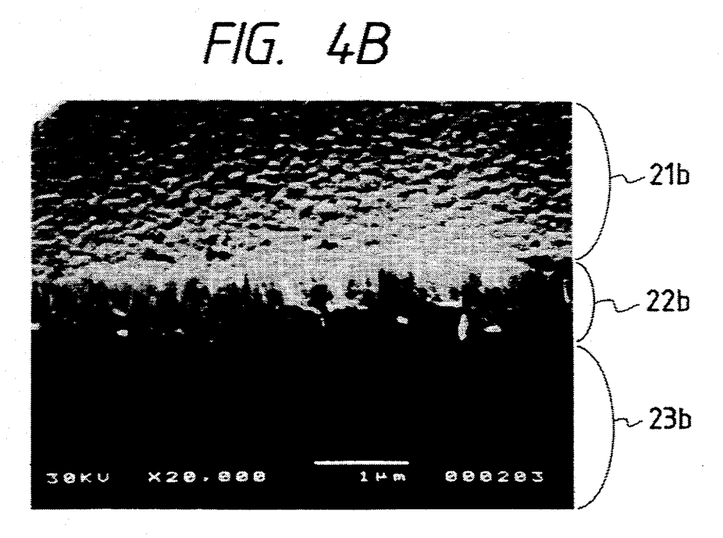
FIG. 4B is a sectional SEM photograph of a silicon carbide film formed by the RF magnetron sputtering method under a high argon pressure (12 mTorr).
Figure 5A:
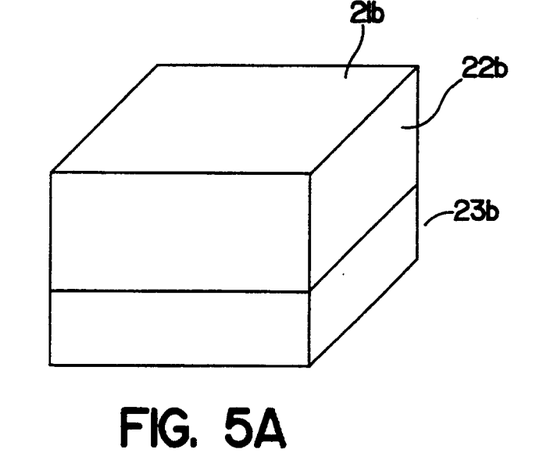
FIG. 5A is a schematic drawing of the structure shown in the sectional SEM photograph of FIG. 4A.
Figure 5B:
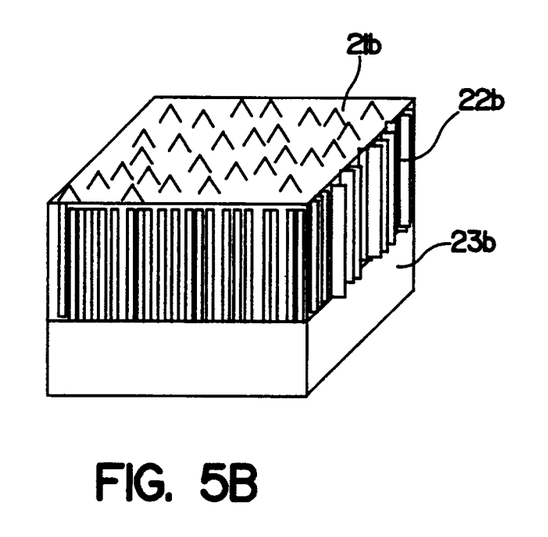
FIG. 5B is a schematic drawing of the structure shown in the sectional SEM photograph of FIG. 4B.

The columnar growth structures will be described with detail in reference to FIGS. 4A and 4B (FIGS. 5A and 5B).

FIG. 4A is a sectional SEM photograph of a silicon carbide film formed by an RF magnetron sputtering method under a low argon pressure (0.8 mTorr), FIG. 5A is a schematic drawing of the film structure of FIG. 4A, FIG. 4B is a sectional SEM photograph of a silicon carbide film formed by the high-frequency magnetron sputtering method under a high argon pressure (12 mTorr) and FIG. 5B is a schematic drawing of the film structure or FIG. 4B.

The columnar growth structures referred to in the present invention mean crystalline structures which are columnar oriented in the thickness direction of the film, as shown in a region 22b of FIG. 4B (or FIG. 5B), and these columnar growth structures can be clearly observed in the sectional SEM photograph of the film. Preferably, the diameter of the columnar growth structures is in the range of 50 to 1000 Å in term of values measured from the sectional SEM photograph of the film.

Further, the diameter of the columnar growth structure may be easily known by measuring the diameters of plural columnar growth structures observed in the SEM image, followed by statistical calculation of the obtained data. Otherwise, the SEM image of the sectional surface of the film may be subjected to an appropriate image processing for determination of the diameter of the columnar growth structure.

On the other hand, the columnar growth structure is closely related to the density of the film, and in case of a large diameter, the density will be low, while in case of a small diameter, the density will be high. This is due to the existence of a grain boundary or void space between respective grains in the case of a large columnar growth structure with clear boundaries. Such a fine structure observed in a film formed by the sputtering method is described in e.g. "Sputtering Phenomenon" by Kinbara, issued from Tokyo University Press (1984). Therefore, in the present invention, the film density is defined by using the diameter of the columnar growth structure. For example, for the silicon carbide films of FIGS. 4A and 4B, the columnar growth structure in the region 22b of FIG. 4B has a diameter of 600 Å, while no columnar growth structure is found in the region 22a of FIG. 4A (i.e. a diameter of less than 40 Å). Also, we obtained a silicon carbide film formed under an argon pressure of 10.0 m Tort (not shown in the drawings) having a columnar growth structure with a diameter of 500 Å.

An X-ray mask support and an X-ray mask structure of the present invention will be described with detail in reference to the drawings.

Figure 1A:
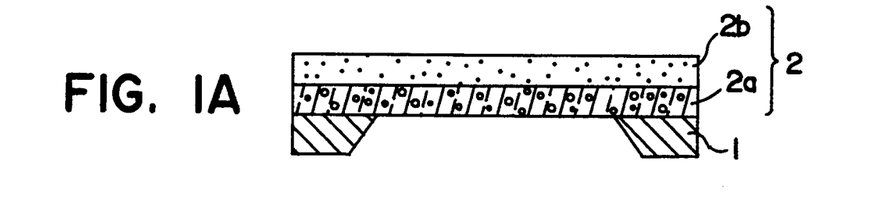
FIG. 1A is a schematic sectional view illustrating the basic constitution of an X-ray mask support of the present invent ion.
Figure 1B:
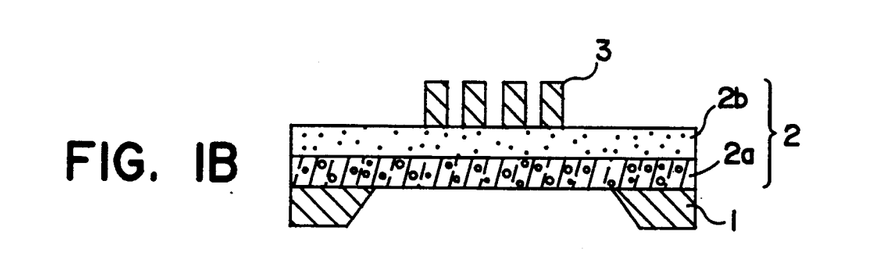
FIG. 1B is a schematic sectional view illustrating the basic constitution of an X-ray mask structure of the present invention.

FIG. 1A is a schematic sectional view illustrating the constitution of the X-ray mask support of the present invention, and FIG. 1B is a schematic sectional view illustrating the X-ray mask structure of the present invention. In FIGS. 1A and 1B, reference numeral 1 is a support frame, numeral 2 is an X-ray permeable film, and 3 is an X-ray absorber.

In the present invention, the X-ray permeable film 2 is characterized by being made up of a multi-layer laminate film comprising at least two layers having different densities, as shown in FIGS. 1A and 1B, or a single-layer film having continuously different densities in its thickness direction.

Examples of the main material constituting the multi-layer laminate film or the single-layer film include preferably carbon and silicon (C-Si), nitrogen and silicon (N-Si) and nitrogen and aluminum (N-Al). In particular, it is more preferable from the viewpoint of the effect of the present invention to use the material containing carbon and silicon (C-Si) as the main components. Furthermore, in the multi-layer laminate film, the main constitutional elements of the respective layers are identical, but physical properties of the respective layers are different between the mutually adjacent layers, which will be described hereinafter.

In the present invention, the thickness of the X-ray permeable film 2 is in the range of 0.5 to 10 μm, preferably 1 to 5 μm. In the multi-layer laminate film, the thickness of the first layer 2a having the high density adjacent to the support frame 1 of the X-ray permeable film 2 is preferably not less than 100 Å, more preferably from 100 to 5000 Å, and it is preferable from the viewpoint of the effect of the present invention that the thickness of the second layer 2b is adjusted so that the whole film thickness of the X-ray permeable film 2 which is the multi-layer laminate film may be from 0.5 to 10 μm, preferably 1 to 5 μm.

In the present invent ion, the support frame 1 is formed from preferably a material such as a typically usable single-crystal silicon substrate. Moreover, the X-ray absorber 3 disposed on the X-ray permeable film 2 is formed from a typically usable material such as Au, Ta, W, Pt or a compound thereof which can absorb the X-rays, and it is then patterned into a desired pattern to obtain the X-ray mask structure, as shown in FIG. 1B. This X-ray absorber 3 usually has a thickness of not less than 0.2 μm, preferably 0.5 to 1 μm.

In the first place, reference will be made to a case that the X-ray permeable film 2 comprises the multi-layer laminate film. The multi-layer laminate film has the following features: That is, (i) The respective layers of the X-ray permeable film (in FIGS. 1A and 1B, the first layer and the second layer are named 2a and 2b, respectively) can be formed from compounds in which the main constitutional elements are identical, respectively.

(ii) The layer A adjacent to the support frame 1 (the first layer 2a in FIGS. 1A and 1B) has a higher density than the layer B (the second layer 2b in FIGS. 1A and 1B) adjacent to the layer A.

In addition, the first layer 2a shown in FIGS. 1A and 1B regarding the feature (ii) is a high-density film having no columnar growth structures therein, and the second layer 2b does not have such a high density.

In the above-mentioned features (i) and (ii), the respective layers of the multi-layer laminate film constituting the X-ray permeable film 2 are made up of the materials in which the main constitutional elements are identical, but these layers are different from each other in physical characteristics such as stress and visible/-near infrared ray permeability. This reason can be considered to be attributable to a difference of the internal structure of the film in each layer, for example, density or a bonding state. Particularly with regard to the density, the first layer 2a has a higher density than the second layer 2b, as described above.

Figure 2A:
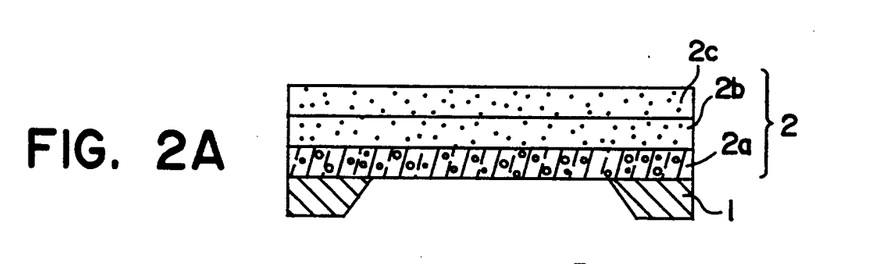
FIG. 2A is a schematic sectional view illustrating the constitution of the X-ray mask support of the present invention in which an X-ray permeable-film comprises a three-layer structure film.
Figure 2B:
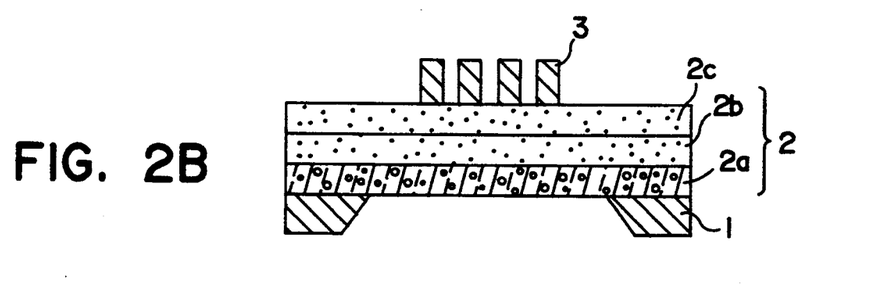
FIG. 2B is a schematic sectional view illustrating the constitution of the X-ray mask structure using the same.

The X-ray mask support and the X-ray mask structure of the present invention have been described above with reference to FIGS. 1A and 1B, but they should not be limited to the embodiments shown in FIGS. 1A and 1B. That is, the X-ray permeable film 2 shown in FIGS. 1A and 1B has the two-layer laminate structure, but it may have a three-layer or a more-layer laminate structure, as shown in FIGS. 2A and 2B. Incidentally, in FIGS. 2A and 2B, except for the third layer 2c of the multi-layer laminate film constituting the X-ray permeable film 2, the reference numerals 1 to 3 and 2a and 2b denote the same members as in FIGS. 1A and 1B.

The third layer 2c shown in FIGS. 2A and 2B is a layer having a high density similar to the first layer 2a, and in other words, this third layer 2c has a higher density than the second layer 2b adjacent thereto.

The change of the density referred to in this specification can be measured by measuring the weight of the X-ray mask support each time a unit area of the X-ray mask support is etched as much as a unit thickness, or by measuring the absorption of X-rays or visible rays each time the X-ray mask support is etched as much as the unit thickness.

Furthermore, it is preferred that the X-ray permeable film 2 constituting the X-ray mask support and the X-ray mask structure of the present invention has the multi-layer laminate structure having the discontinuously different densities and a hydrogen content in the X-ray permeable film 2 is substantially 0%. In recent years, as the most important one of physical characteristics required for the X-ray permeable film 2, resistance to radiation is discussed. For example, with regard to silicon nitride and boron nitride which have been researched as X-ray permeable materials, it has been reported that the hydrogen content of the film which is attributable to a conventional preparation method such as the CVD method using a special gas for the formation of the X-ray permeable film has a great influence on the resistance to radiation (Proceedings of the 46th Spring Conference of Oyo-butsuri Gakkai, Toshiba, J. Vac. Sci. Technol. B5(1), Jan/Feb 1987 AT&T Bell Lab). However, if the X-ray permeable film is formed in accordance with a sputtering method using Ar which is an inert gas, as in the method of the present invention, the X-ray permeable film can be obtained which is substantially free from hydrogen, i.e, which is excellent in the resistance to radiation.

Therefore, in the method for preparing the X-ray mask support of the present invention, the multi-layer laminate film of the X-ray permeable film 2 is characteristically formed by the sputtering method, and the other films are formed by a conventional known process.

In general, when the film formation is carried out by the use of the sputtering method, the film obtained under a low gas pressure is a high-density film having no columnar growth structures, but conversely the film obtained under a high gas pressure is a low-density film having the columnar growth structures. The diameter of each prismatic crystalline structure depends upon the gas pressure. Therefore, the structure of each layer in the multi-layer laminate film can be changed by altering the conditions of the gas pressure during the film formation of each film.

Accordingly, in forming the multi-layer laminate film of the X-ray permeable film 2 by the sputtering process in accordance with the method for preparing the X-ray mask support of the present invention, the layer (e.g., the first layer 2a) having the high dens ity can be formed under a low gas pressure of 0.5 to 1 mTorr at the time of the film formation, and the other layer (e.g., the second layer 2b) can be formed under a high gas pressure of 5 to 20 mTorr at the time of the film formation.

The above-mentioned description has referred to the case that the X-ray permeable film is formed from the multi-layer laminate film having the discontinuously different densities and comprising the compounds which allow the respective layers to have the same main constitutional element, but the above-mentioned constitution and properties of the film, the preparation process of the mask support and the like are substantially unchanged in the case that the X-ray permeable film is formed from the single-layer film having the continuously different densities (or the diameter of the prismatic crystalline structures) which is another embodiment of the present invention.

However, in forming the single-layer film having the continuously different densities or the continuously different diameters of the columnar growth structures in its thickness direction by the use of the sputtering method, the gas pressure at the time of the film formation of the X-ray permeable film can start with a low gas pressure of about 0.5 mTorr, and during the film formation, the gas pressure can be gradually and continuously increased.

Next, the present invention will be described with detail in reference to the following examples.

EXAMPLE 1

A silicon carbide film having a thickness of 2000 Å was formed on one surface of a double side-polished silicon single-crystal substrate (face orientation 100) having a thickness of 2 mm by an RF magnetron sputtering method. With regard to film formation conditions in this case, an argon pressure was 0.8 mTorr, an input power was 1.5 KW, and a substrate temperature was room temperature. Afterward, the silicon carbide film was subjected to plasma etching to remove desired parts therefrom, thereby preparing a pattern.

Next, on the other surface of this silicon single-crystal substrate, a silicon carbide (SiC) film having a thickness of 3000 Å was formed in accordance with the RF magnetron sputtering method. A sputter gas which was used in this case was only argon, and with regard to the film formation conditions, the argon pressure was 0.8 mTorr, the input power was 1.5 KW, and the substrate temperature was 400° C.

Afterward, on the thus prepared silicon carbide film, a silicon carbide film having a thickness of 1.5 μm was successively formed in the same chamber under an argon pressure of 12 mTorr at an input power of 900 W at a substrate temperature of 400° C.

After these steps, a gold pattern was formed in a desired region on the thus formed silicon carbide multi-layer film in accordance with a selective plating method which was conventional and known.

Finally, while this pattern was protected, the part on the silicon single-crystal substrate which was not covered with the silicon carbide multi-layer film was etched with a 30% aqueous potassium hydroxide (KOH) solution at 110° C. to expose the multi-layer film, thereby obtaining an X-ray mask structure.

Furthermore, when the thus obtained X-ray permeable film was irradiated with soft X-rays having a wavelength of 10 Å, permeability was 62%. On the contrary, in comparison with an X-ray permeable film comprising a silicon carbide single-layer film having the same thickness as in this example formed on the same silicon single-crystal substrate, it was apparent that the permeability was improved by as much as about 10%.

EXAMPLE 2

A method for preparing an X-ray mask support of the present invention will be described with reference to a schematic sectional view for the explanation of manufacturing methods of an X-ray mask support and an X-ray mask structure shown in FIGS. 3A to 3G.

Figure 3A:
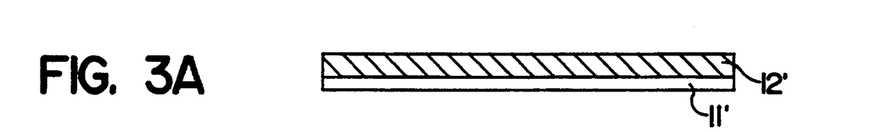
FIGS. 3A to 3G are schematic sectional views illustrating a preparation process of the X-ray mask support and the X-ray mask structure of the present invention.

In the first place, as shown in FIG. 3A, a silicon nitride film 11 having a thickness of about 1500 Å was formed on one surface of a double side-polished silicon single-crystal substrate (face orientation 100) 12 having a thickness of 2 mm by a thermochemical vapor phase growth method (thermal CVD method), as in Example 1.

Figure 3B:
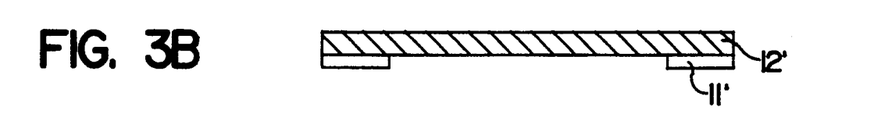

Next, the silicon nitride film 11 was subjected to a plasma etching process to remove desired regions therefrom, thereby forming a pattern 11' (FIG. 3B). In forming the pattern 11', a patterned resist was used as a protective film, and a mixed gas of carbon tetrafluoride ($CF_4$) and hydrogen ($H_2$) was used as an etching gas.

Figure 3C:
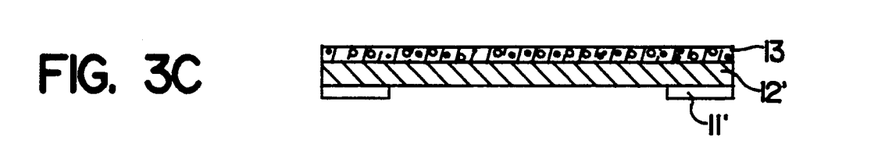

Then, on the other surface of this silicon single-crystal substrate 12, a silicon carbide (SiC) film having a thickness of about 2000 Å was formed in accordance with an RF magnetron sputtering method (FIG. 3C). A sputter gas which was used in this case is only argon (Ar), and with regard to the film formation conditions, a substrate temperature was 400° C., an argon pressure was 0.8 mTorr, and an input power was 900 W.

Figure 3D:
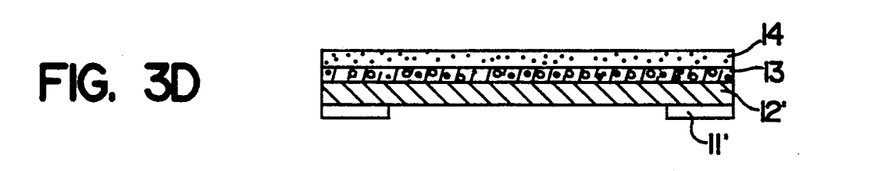
Figure 3E:
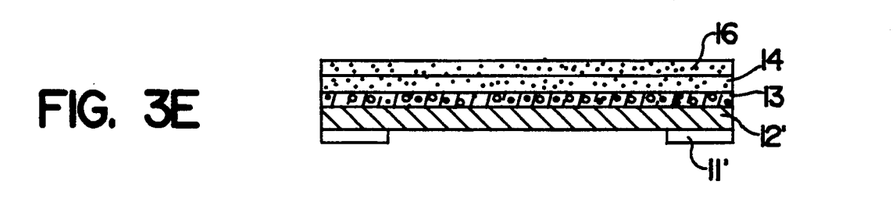

Afterward, on the thus prepared silicon carbide film 13 formed by the above-mentioned procedure, a silicon carbide film 14 having a thickness of 1.5 μm was successively formed in the same chamber at a substrate temperature of 400° C. under an argon pressure of 12 mTorr at an input power of 900 W, as shown in FIG. 3D.

Furthermore, on this silicon carbide film 14, a silicon carbide film 16 having a thickness of 2000 Å was formed (FIG. 3E) at a substrate temperature of 400° C. under an argon pressure of 0.8 mTorr at an input power of 900 W to obtain an X-ray permeable film comprising the multi-layer laminate film, whereby an X-ray support of the present invention was formed.

Figure 3F:
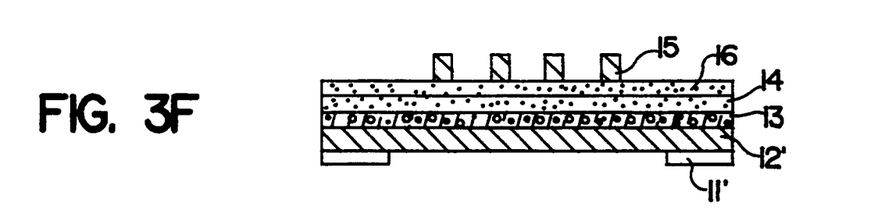

After these steps, a transfer pattern 15 of gold (Au) which was an absorber was formed in a predetermined region on the silicon carbide film 16, as shown in FIG. 3F. In forming the transfer pattern 15, a conventional selective plating method was used, and its thickness was 5000 Å.

Figure 3G:
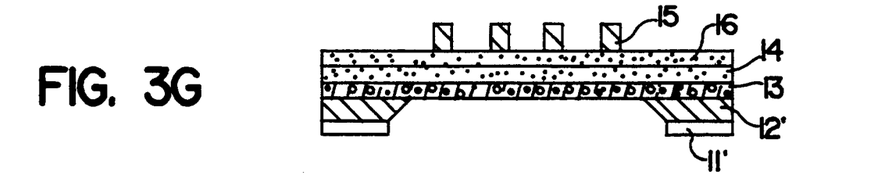

Finally, while this gold transfer pattern 15 was protected, a predetermined region of the silicon single-crystal substrate 12 was etched, using the silicon nitride film pattern 11' as a protective film. As an etching solution, a mixture of nitric acid and hydrofluoric acid solution which was heated up to 110° C. was used, and the etching was carried out until the silicon carbide film 13 was exposed, to form a window frame-like reinforcing support frame 12, whereby such an X-ray mask structure of the present invention as shown in FIG. 3G was obtained.

Among the respective layers of the X-ray permeable film comprising the multi-layer laminate film obtained by the above-mentioned procedure, the silicon carbide layer 13 formed under a low argon pressure of 0.8 mTorr had such a structure that any crystalline structure was not seen even through a sectional observation of about 20,000× magnification by a scanning electron microscope (SEM), which meant that the layer 13 was in a dense state. Moreover, this film had resistance to an alkaline solution, and therefore it functioned as an etching stop layer in etching the silicon single-crystal substrate 12. In addition, with regard to the silicon carbide layer 13 which had undergone the etching treatment, surface state, stress, permeability and the like were substantially unchanged.

On the other hand, among the respective layers of the X-ray permeable film comprising the multi-layer laminate film, the silicon carbide layer 14 formed under a high argon pressure of 12 mTorr was observed by SEM, and it was apparent that columnar growth structures having a diameter of about 500 to about 1000 Å were present.

In this connection, FIGS. 4A and 4B show sketches of sectional SEM photographs of silicon carbide films obtained under an argon pressure of 0.8 mTorr and an argon pressure of 12 mTorr.

In the vicinity of the respective layers of the multilayer laminate film formed under the film forming conditions described in this example, the smaller the diameter of the columnar growth structures, the larger its compression stress was. As the diameter of the columnar growth structures increased, the compression stress was relieved, and when the diameter of the prismatic crystalline structures exceeded a certain level, the compression stress was converted into tensile stress.

Since the X-ray permeable film formed in this example had a three-layer laminate structure, stress control could be accurately achieved by controlling the thickness of each layer. In the X-ray mask structure obtained in the above-mentioned manner, the whole stress of the X-ray absorber which was the multi-layer laminate film could be controlled to a low tensile stress of $3.2 \times 10^8$ dyn/cm$^2$.

Furthermore, when the X-ray permeable film obtained in the above-mentioned manner was irradiated with soft X-rays having a wavelength of 10 Å, X-ray permeability was 60%, and in comparison with an X-ray permeable film comprising a silicon carbide single-layer film having the same thickness, it was apparent that the permeability in Example 2 was improved by as much as about 10%.

EXAMPLE 3

A predetermined region on one surface of the same double side-polished silicon single-crystal substrate (face orientation 100) having a thickness of 2 mm as in Example 1 was masked, and a silicon carbide film having a thickness of about 1500 Å was formed thereon at a substrate temperature of room temperature under an argon pressure of 0.8 mTorr at an input power of 1 kW by a RF magnetron sputtering method.

Next, on the other surface of this silicon single-crystal substrate, a silicon carbide film having a thickness of 2 μm was formed by the use of the same RF magnetron sputtering device to obtain an X-ray permeable film of a single-layer film having continuously different densities. In this case, the argon pressure was gradually increased from 1 mTorr to 10 mTorr over 3 hours in accordance with a linear function, maintained at 10 mTorr for 4 hours, and then gradually decreased from 10 mTorr to 1 mTorr over 3 hours in accordance with the linear function by controlling a mass flow controller with a computer.

With regard to the other film forming conditions, the substrate temperature was 450° C. and the input power was constantly 800 W, and matching adjustment was carried out on occasion in accordance with the alteration of the above-mentioned argon pressure.

At the point of time when the X-ray permeable film of the single-layer film was formed by the above-mentioned procedure, warp of the silicon substrate was measured and stress of the above-mentioned silicon carbide single-layer film was measured. As a result, it was apparent that tensile stress was $4.5 \times 10^8$ dyn/cm$^2$.

Furthermore, an absorber pattern of gold was formed on the obtained silicon carbide film in the same manner as in Example 1, and afterward the back surface of the silicon single-crystal substrate was etched to obtain an x-ray mask structure of the present invention.

For the X-ray permeable film comprising the single-layer film obtained by the above-mentioned procedure, sectional observation was carried out by the use of an SEM, and as a result, it was apparent that parts adjacent to the silicon single-crystal substrate and parts near to the film surface had fine columnar growth structures whose diameter was considered to be 50 Å or less. The columnar growth structures enlarged and grew toward the center of the X-ray permeable film, and the diameter of the columnar growth structures in the center of the film was about 800 Å.

When the X-ray permeable film obtained in the above-mentioned manner was irradiated with sort X-rays having a wavelength of 10 Å, permeability was 58%, and in comparison with an X-ray permeable film comprising a silicon carbide single-layer film having the same thickness, i.e., 2 μm, it was apparent that the permeability was improved as much as about 10%.

EXAMPLE 4

An X-ray exposure experiment was carried out by the use of an X-ray mask structure of the present invention prepared in Example 1. In this case, the exposure system was of a proximity type and a light source was a synchrotron radiation light.

In the first place, a silicon wafer was spin coated with a novolak based chemical amplification type resist (RAY-PN Hoechst Corp.) to a thickness of about 1 μm, and after bake drying, the wafer was set together with the mask in an exposure chamber, which was then evacuated to about $6 \times 10^{-7}$ Tort. Afterward, helium (He) gas was introduced into the chamber, and exposure was then performed for about 1 second in an atmosphere of 150 Tort. After the exposure, a bake treatment was carried out, and the exposed sample was then baked again and developed with an agueous organic alkaline solution to obtain a resist pattern having a line width of 0.5 μm which was the same as that of an absorber pattern on the X-ray mask structure.

In addition, the 10 samples were continuously baked in the same manner, and as a result, the position fluctuation of the resultant resist patterns was about 0.04 μm, which satisfied precision standards.

As described above, in an X-ray mask support and an X-ray mask structure of the present invention, an X-ray permeable film is formed of a multi-layer laminate film of layers having different densities and comprising compounds in which the main constitutional element is identical, or is formed of a single-layer film having continuously changing densities in its thickness direction Therefore, X-ray permeability and visible/near infrared ray permeability can be improved, while mechanical strength required for the X-ray mask support and resistance to an alkali at the time of manufacture are maintained. In addition, the X-ray mask support and the X-ray mask structure of the present invention can contribute to the improvement of throughput and alignment precision.

In comparison with the case that a conventional multi-layer laminate film comprising different kinds of materials is used for the X-ray permeable film, the X-ray mask support and the X-ray mask structure of the present invention can simplify a manufacturing process and can increase productivity and safety. Furthermore, when they are irradiated with highly strong light such as synchrotron radiation light, temperature rise can be controlled, since the absorption of the X-ray permeable film itself is small. In addition, the X-ray mask support and the X-ray mask structure of the present invention comprise the single material in contrast to the conventional product, and therefore there can be inhibited, to a minimum level, strain which is attributable to a difference of thermal expansion coefficients inherent in the materials at the time of heating caused by irradiation of X-rays.

In a method for preparing the X-ray mask support of the present invention, the X-ray permeable film is formed by the use of a sputtering method. Therefore, the method of the present invention has higher safety as compared with a CVD method (e.g., Japanese Patent Application Laid-Open No. 1-12728) which has often been used so tar, and safety assurance can be achieved by a low facility investment. In consequence, the X-ray mask support and X-ray mask structure can be provided safely and economically.

In the case that the X-ray permeable film is formed by the CVD method, hydrogen which is used as a carrier gas is inevitably introduced into the film and will cause radiation damage. On the contrary, the film formed by the sputtering technique in the method of the present invention is substantially free from hydrogen, and therefore the X-ray mask support of the present invention cam stably function, even when irradiated with radiation.

When a low argon pressure is employed at the film formation, the X-ray permeable film prepared by the use of the sputtering process is free from crystalline structures and has a high density. In addition, such a film has strong resistance to an alkaline solution such as an etching solution. On the other hand, when a high argon pressure is employed at the film formation, the low-density film is formed which has columnar growth structures with a large diameter, and X-ray permeability and visible/near infrared ray permeability of this film are advantageously high. According to the method of the present invention, composite films of these two kinds can be formed from the same materials in the same chamber by the same film formation process, and thus characteristics of the mask support and the mask structure can be improved, and easiness, safety, productivity and yield at the time of the preparation can also be improved.

In the preparation method of the present invention, if film forming conditions such as input power are set in a suitable range, internal stress of the film can be converted from compression stress to tensile stress with the increase or the diameter of the columnar growth structures in the formed film. Therefore, the films having such stresses contrary to each other can be easily composed, and the X-ray permeable film having the desired stress can be easily obtained by the control of a film thickness or the like.

What is claimed is:

1. An X-ray mask support having an X-ray permeable film and a support frame for supporting said X-ray permeable film, said X-ray permeable film mainly comprising a single-layer film having different densities in its thickness direction.

2. The X-ray mask support according to claim 1, wherein a portion of said single-layer film has a columnar growth structure.

3. The X-ray mask support according to claim 1, wherein said single-layer film is disposed adjacent to said support frame, and the density of said single-layer film in the vicinity of its film surface adjacent to said support frame is higher than the density of said single-layer film in the vicinity of its film surface opposite to said film surface adjacent to said support frame.

4. The X-ray mask support according to claim 3, wherein the single-layer film has a columnar growth structure in the vicinity of its film surface opposite to the film surface adjacent to said support frame.

5. The X-ray mask support according to claim wherein the film surface of said single-layer film adjacent to said support frame is better in alkali resistance than the film surface opposite to said film surface adjacent to said support frame.

6. The X-ray mask support according to claim 3, wherein the film surface of said single-layer film adjacent to said support frame is better in acid resistance than the film surface opposite to said film surface adjacent to said support frame.

7. The X-ray mask support according to claim 1, wherein said single-layer film is disposed adjacent to said support frame, and the densities of said single-layer film in the vicinity of its film surface adjacent to said support frame and in the vicinity of its film surface opposite to said film surface adjacent to said support frame are higher than the density of the inner portion in said single-layer film.

8. The X-ray mask support according to claim 7, wherein the inner portion of said single-layer film has a columnar growth structure.

9. The X-ray mask support according to claim 1, wherein said single-layer film is comprised of one material selected from the group consisting of silicon, carbon, aluminum, boron and their nitrides or oxides.

10. The X-ray mask support according to claim 1, wherein said single-layer film is comprised of one compound selected from the group consisting of silicon carbide, silicon nitride and aluminum nitride.

11. The X-ray mask support according to claim 1, wherein said support frame is comprised of one material selected from the group consisting of silicon, quartz, glass, titanium, titanium alloys, stainless steel and ceramics.

12. The X-ray mask support according to claim 1, wherein the thickness of said X-ray permeable film is in the range of 0.5 to 10 $\mu$m.

13. The X-ray mask support according to claim 1, wherein the thickness of said X-ray permeable film is in the range of 1 to 5 $\mu$m.

14. An X-ray mask support having an X-ray permeable film and a support frame for supporting said X-ray permeable film, said X-ray permeable mainly comprising a multi-layer laminate film in which adjacent layers have different densities, and all the layers of said multi-layer laminate film are comprised of compounds having the same main constitutional elements.

15. The X-ray mask support according to claim 14, wherein at least one of the layers comprising said multi-layer laminate film has a columnar growth structure.

16. The X-ray mask support according to claim 14, wherein said multi-layer laminate film is disposed adjacent to said support frame, and among the layers comprising said multi-layer laminate film, the layer adjacent to said support frame has a higher density than the layer adjacent to said layer.

17. The X-ray mask support according to claim 16, wherein among the layers comprising said multi-layer laminate film, the layer adjacent to said support frame is better in alkali resistance than the layer adjacent to said layer.

18. The X-ray mask support according to claim 16, wherein among the layers comprising said multi-layer laminate film, the layer adjacent to said support frame is better in acid resistance than the layer adjacent to said layer.

19. The X-ray mask support according to claim 16, wherein said multi-layer laminate film is a two-layer laminate film comprising a layer A adjacent to said support frame and a layer B adjacent to said layer A, and the density of said layer A is higher than that of said layer B.

20. The X-ray mask support according to claim 19, wherein said layer B has a columnar growth structure.

21. The X-ray mask support according to claim 16, wherein said multi-layer laminate film is a three-layer laminate film comprising a layer A adjacent to said support frame, a layer B adjacent to said layer A, and a layer C adjacent to said layer B, and the density of said layer A is higher than that of said layer B, and the density of said layer C is higher than that of said layer B.

22. The X-ray mask support according to claim 21, wherein said layer B has a columnar growth structure.

23. The X-ray mask support according to claim 16, wherein the thickness of said multi-layer laminate film is in the range of 0.5 to 10 $\mu$m and the thickness of said layer adjacent to said support frame is not less than 200 Å.

24. The X-ray mask support according to claim 16, wherein the thickness of said multi-layer laminate film is in the range of 1 to 5 $\mu$m, and the thickness of the layer adjacent to said support frame is in the range of 100 to 5000 Å.

25. The X-ray mask support according to claim 14, wherein said multi-layer laminate film is comprised of a material selected from the group consisting of silicon, carbon, aluminum, boron and their nitrides or oxides.

26. The X-ray mask support according to claim 14, wherein said multi-layer laminate film is comprised of one compound selected from the group consisting of silicon carbide, silicon nitride and aluminum nitride.

27. The X-ray mask support according to claim 14, wherein said support frame is comprised of one material selected from the group consisting of silicon, quartz, glass, titanium, titanium alloys, stainless steel and ceramics.

28. An X-ray mask structure having an X-ray permeable film, a support frame for supporting said X-ray permeable film and an X-ray absorber supported by said X-ray permeable film, said X-ray permeable film mainly comprising a single-layer film having different densities in its thickness direction.

29. The X-ray mask structure according to claim 28, wherein a portion of said single-layer film has a columnar growth structure.

30. The X-ray mask structure according to claim 29, wherein said single-layer film is disposed adjacent to said support frame, and the density of said single-layer film in the vicinity of its film surface adjacent to said support frame is higher than the density of said single-layer film in the vicinity of the film surface opposite to said film surface adjacent to said support frame 31. The X-ray mask structure according to claim 30, wherein the single-layer film has a columnar growth structure in the vicinity of its film surface opposite to the film surface adjacent to said support frame.

32. The X-ray mask structure according to claim 30, wherein the film surface of said single-layer film adjacent to said support frame is better in alkali resistance than the film surface opposite to said film surface adjacent to said support frame.

33. The X-ray mask structure according to claim 30, wherein the film surface of said single-layer film adjacent to said support frame is better in acid resistance than the film surface opposite to said film surface adjacent to said support frame.

34. The X-ray mask structure according to claim 28, wherein said single-layer film is disposed adjacent to said support frame, and the densities of said single-layer film in the vicinity of its film surface adjacent to said support frame adjacent to said support frame and in the vicinity of the film surface opposite to said film surface adjacent to said support frame are higher than the density of the inner portion in said single-layer film.

35. The X-ray mask structure accordinq to claim 34, wherein the inner portion of said single-layer film has a columnar growth structure.

36. The X-ray mask structure according to claim 28, wherein said single-layer film is comprised of one material selected from the group consisting of silicon, carbon, aluminum, boron and their nitrides or oxides.

37. The X-ray mask structure according to claim 28, wherein said single-layer film is comprised of one compound selected from the group consisting of silicon carbide, silicon nitride and aluminum nitride.

38. The X-ray mask structure according to claim 28, wherein said support frame is comprised of one material selected from the group consisting of silicon, quartz, glass, titanium, titanium alloys, stainless steel and ceramics.

39. The X-ray mask structure according to claim 28, wherein said X-ray absorber is comprised of one material selected from the group consisting of Au, Ta, W, Pt and compounds thereof.

40. The X-ray mask structure according to claim 28, wherein the thickness of said X-ray permeable film is in the range of 0.5 to 10 $\mu$m.

41. The X-ray mask structure according to claim 28, wherein the thickness of said X-ray permeable film is in the range of 1 to 5 $\mu$m.

42. The X-ray mask structure according to claim 28, wherein the thickness of said X-ray absorber is not less than 0.2 $\mu$m.

43. The X-ray mask structure according to claim 28, wherein the thickness of said X-ray absorber is in the range of 0.5 to 1 $\mu$m.

44. An X-ray mask structure having an X-ray permeable film, a support frame for supporting said X-ray permeable film and an X-ray absorber supported by said X-ray permeable film, said X-ray permeable film mainly comprising a multi-layer laminate film in which adjacent layers have different densities, and all the layers of said multi-layer laminate film are comprised of compounds having the same main constitutional elements.

45. The X-ray mask structure according to claim 44, wherein at least one of the layers comprising said multi-layer laminate film has a columnar growth structure.

46. The X-ray mask structure according to claim 44, wherein said multi-layer laminate film is disposed adjacent to said support frame, and among the layers comprising said multi-layer laminate film, the density of the layer adjacent to said support frame is higher than that of the layer adjacent to said layer.

47. The X-ray mask structure according to claim 46, wherein among the layers comprising said multi-layer laminate film, the layer adjacent to said support frame is better in alkali resistance than the layer adjacent to said layer.

48. The X-ray mask structure according to claim 46, wherein among the layers comprising said multi-layer laminate film, the layer adjacent to said support frame is better in acid resistance than the layer adjacent to said layer.

49. The X-ray mask structure according to claim 46, wherein said multi-layer laminate film is a two-layer laminate film comprising a layer A adjacent to said support frame and a layer B adjacent to said layer A, and the density of said layer A is higher than that of said layer B.

50. The X-ray mask structure according to claim 49, wherein said layer B has a columnar growth structure.

51. The X-ray mask structure according to claim 46, wherein said multi-layer laminate film is a three-layer laminate film comprising a layer A adjacent to said said support frame, a layer B adjacent to said layer A, and a layer C adjacent to said layer B, and the density of said layer A is higher than that of said layer B, and the density of said layer C is higher than that of said layer B.

52. The X-ray mask structure according to claim 51, wherein said layer B has a columnar growth structure.

53. The X-ray mask structure according to claim 46, wherein the thickness of said multi-layer laminate film is in the range of 0.5 to 10 $\mu$m and the thickness of said layer adjacent to said support frame is not less than 200 Å.

54. The X-ray mask structure according to claim 46, wherein the thickness of said multi-layer laminate film is in the range of 1 to 5 $\mu$m, and the thickness of the layer adjacent to said support frame is in the range of 100 to 5000 Å.

55. The X-ray mask structure according to claim 44, wherein said multi-layer laminate film is comprised of a material selected from the group consisting of silicon, carbon, aluminum, boron and their nitrides or oxides.

56. The X-ray mask structure according to claim 44, wherein said multi-layer laminate film is comprised of one compound selected from the group consisting of silicon carbide, silicon nitride and aluminum nitride.

57. The X-ray mask structure according to claim 44, wherein said support frame is comprised of one material selected from the group consisting of silicon, quartz, glass, titanium, titanium alloys, stainless steel and ceramics.

58. The X-ray mask structure according to claim 44, wherein said X-ray absorber is comprised of one material selected from the group consisting of Au, Ta, W, Pt or compounds thereof.

59. The X-ray mask structure according to claim 44, wherein the thickness of said X-ray absorber is not less than 0.2 $\mu$m.

60. The X-ray mask structure according to claim 44, wherein the thickness of said X-ray absorber is in the range of 0.5 to 1 $\mu$m.

61. An X-ray exposure method comprising:
providing an X-ray mask structure including an X-ray permeable film, a support frame for supporting said X-ray permeable film and an X-ray absorber supported on said X-ray permeable film, and said X-ray permeable film mainly comprising a single-layer film having different densities in its thickness direction; and
exposing a member to be exposed to X-rays through said X-ray mask structure.

62. The X-ray exposure method according to claim 61, wherein a portion of said single-layer film has a columnar growth structure.

63. The X-ray exposure method according to claim 61, wherein said single-layer film is disposed adjacent to said support frame, and the density of said single-layer film in the vicinity of its film surface adjacent to said support frame is higher than the density of said single-layer film in the vicinity of the film surface opposite to said film surface adjacent to said support frame.

64. The X-ray exposure method according to claim 63, wherein the single-layer film has a columnar growth structure in the vicinity of its film surface opposite to the film surface adjacent to said support frame.

65. The X-ray exposure method according to claim 63, wherein the film surface of said single-layer film adjacent to said support frame is better in alkali resistance than the film surface opposite to said film surface adjacent to said support frame.

66. The X-ray exposure method according to claim 63, wherein the film surface of said single-layer film adjacent to said support frame is better in acid resistance than the film surface opposite to said film surface adjacent to said support frame.

67. The X-ray exposure method according to claim 61, wherein said single-layer film is disposed adjacent to said support frame, and the densities of said single-layer film in the vicinity of its film surface adjacent to said support frame and in the vicinity of the film surface opposite to said film surface adjacent to said support frame are higher than the density of the inner portion in said single-layer film.

68. The X-ray exposure method according to claim 67, wherein the inner portion of said single-layer film has a columnar growth structure.

69. The X-ray exposure method according to claim 61, wherein said single-layer film is comprised of one material selected from the group consisting of silicon, carbon, aluminum, boron and their nitrides or oxides.

70. The X-ray exposure method according to claim 61, wherein said single-layer film is comprised of one compound selected from the group consisting of silicon carbide, silicon nitride and aluminum nitride.

71. The X-ray exposure method according to claim 61, wherein said support frame is comprised of one material selected from the group consisting of silicon, quartz, glass, titanium, titanium alloys, stainless steel and ceramics.

72. The X-ray exposure method according to claim 61, wherein said X-ray absorber is comprised of one material selected from group consisting of Au, Ta, W, Pt and the compounds thereof.

73. The X-ray exposure method according to claim 61, wherein the thickness of said X-ray permeable film is in the range of 0.5 to 10 $\mu$m.

74. The X-ray exposure method according to claim 61, wherein the thickness of said X-ray permeable film is in the range of 1 to 5 μm.

75. The X-ray exposure method according to claim 61, wherein the thickness of said X-ray absorber is not less than 0.2 μm.

76. The X-ray exposure method according to claim 61, wherein the thickness of said X-ray absorber is in the range of 0.5 to 1 μm.

77. An X-ray exposure method comprising:
providing an X-ray mask structure, said X-ray mask structure including an X-ray permeable film, a support frame for supporting said X-ray permeable film and an X-ray absorber supported on said X-ray permeable film, said X-ray permeable film mainly comprising a multi-layer laminate film in which adjacent layers have different densities, and all the layers of said multi-layer laminate film being comprised of compounds having the same main constitutional elements; and
exposing a member to be exposed to X-rays through said X-ray mask structure.

78. The X-ray exposure method according to claim 77, wherein at least one of the layers comprising said multi-layer laminate film has a columnar growth structure.

79. The X-ray exposure method according to claim 77, wherein said multi-layer laminate film is disposed adjacent to said support frame, and among the layers comprising said multi-layer laminate film, the layer adjacent to said support frame has a higher density than the layer adjacent to said layer.

80. The X-ray exposure method according to claim 79, wherein among the layers comprising said multi-layer laminate film, the layer adjacent to said support frame is better in alkali resistance than the layer adjacent to said layer.

81. The X-ray exposure method according to claim 79, wherein among the layers comprising said multi-layer laminate film, the layer adjacent to said support frame is better in acid resistance than the layer adjacent to said layer.

82. The X-ray exposure method according claim 79, wherein said multi-layer laminate film is a two-layer laminate film comprising a layer A adjacent to said support frame and a layer B adjacent to said layer A, and the density of said layer A is higher than that of said layer B.

83. The X-ray exposure method according to claim 82, wherein said layer B has a columnar growth structure.

84. The X-ray exposure method according to claim 79, wherein said multi-layer laminate film is a three-layer laminate film comprising a layer A adjacent to said support frame, a layer B adjacent to said layer A, and a layer C adjacent to said layer B, and the density of said layer A is higher than that of said layer B, and the density of said layer C is higher than that of said layer B.

85. The X-ray exposure method according to claim 84, wherein said layer B has a columnar growth structure.

86. The X-ray exposure method according to claim 79, wherein the thickness of said multi-layer laminate film is in the range of 0.5 to 10 μm and the thickness of said layer adjacent to said support frame is not less than 200 Å.

87. The X-ray exposure method according to claim 79, wherein the thickness of said multi-layer laminate film is in the range of 1 to 5 μm, and the thickness of the layer adjacent to said support frame is in the range of 100 to 5000 Å.

88. The X-ray exposure method according to claim 77, wherein said multi-layer laminate film is comprised of a material selected from the group consisting of silicon, carbon, aluminum, boron and their nitrides or oxides.

89. The X-ray exposure method according to claim 77, wherein said multi-layer laminate film is comprised of one compound selected from the group consisting of silicon carbide, silicon nitride and aluminum nitride.

90. The X-ray exposure method according to claim 77, wherein said support frame is comprised of one material selected from the group consisting of silicon, quartz, glass, titanium, titanium alloys, stainless steel and ceramics.

91. The X-ray exposure method according to claim 77, wherein said X-ray absorber is comprised of one material selected from the group consisting of Au, Ta, W, Pt and the compounds thereof.

92. The X-ray exposure method according to claim 77, wherein the thickness of said X-ray absorber is not less than 0.2 μm.

93. The X-ray exposure method according to claim 77, wherein the thickness of said X-ray absorber is in the range of 0.5 to 1 μm.

* * * * *

UNITED STATES PATENT AND TRADEMARK OFFICE
CERTIFICATE OF CORRECTION

PATENT NO. : 5,335,256
DATED : August 2, 1994
INVENTOR(S) : Tomoko MARUYAMA, et al.

It is certified that error appears in the above-indentified patent and that said Letters Patent is hereby corrected as shown below:

COLUMN 1:

Line 11, "tills" should read --this--; and
Line 12, "of" should be deleted.

COLUMN 2:

Line 60, "vent ion," should read --vention,--.

COLUMN 3:

Line 17, "invent ion," should read --invention,--; and
Line 66, "are" should read --are only--.

COLUMN 4:

Line 2, "the" (second occurrence) should be deleted;
Line 7, "with detail in" should read --in detail with--;
Line 17, "or" should read --of--; and
Line 58, "with detail in" should read --in detail with--.

COLUMN 5:

Line 29, "invent ion," should read --invention,--.

COLUMN 6:

Line 68, "dens ity" should read --density--.

UNITED STATES PATENT AND TRADEMARK OFFICE
CERTIFICATE OF CORRECTION

PATENT NO. : 5,335,256
DATED : August 2, 1994
INVENTOR(S) : Tomoko MARUYAMA, et al.

It is certified that error appears in the above-indentified patent and that said Letters Patent is hereby corrected as shown below:

COLUMN 7:

Line 27, "with" should read --in--; and
    Line 28, "in" should read --with--.

COLUMN 9:

Line 54, "a" should read --an--.

COLUMN 10:

Line 27, "sort" should read --soft--;
    Line 45, "Tort." should read --Torr.--;
    Line 48, "Tort." should read --Torr.--;
    Line 50, "agueous" should read --aqueous--; and
    Line 65, "tion" should read --tion.--.

COLUMN 11:

Line 28, "tar," should read --far,--; and
    Line 39, "cam" should read --can--.

COLUMN 12:

Line 21, "claim" should read --claim 3,--.

UNITED STATES PATENT AND TRADEMARK OFFICE
CERTIFICATE OF CORRECTION

PATENT NO. : 5,335,256
DATED : August 2, 1994
INVENTOR(S) : Tomoko MARUYAMA, et al.

Page 3 of 3

It is certified that error appears in the above-indentified patent and that said Letters Patent is hereby corrected as shown below:

COLUMN 14:

Line 7, "frame" should read --frame.--;
    Line 26, "adjacent to said support frame" should be deleted; and
    Line 30, "accordinq" should read --according--.

COLUMN 15:

Line 32, "said" (second occurrence) should be deleted.

COLUMN 16:

Line 64, "from" should read --from the--; and
    Line 65, "the" should be deleted.

COLUMN 18:

Line 42, "the" should be deleted.

Signed and Sealed this

Third Day of January, 1995

Attest:

BRUCE LEHMAN

*Attesting Officer*    *Commissioner of Patents and Trademarks*